US008901594B2

(12) United States Patent
Nakatani

(10) Patent No.: US 8,901,594 B2
(45) Date of Patent: Dec. 2, 2014

(54) ORGANIC EL DISPLAY PANEL AND METHOD FOR MANUFACTURING SAME

(75) Inventor: Shuhei Nakatani, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/992,912

(22) PCT Filed: Oct. 18, 2011

(86) PCT No.: PCT/JP2011/005813
§ 371 (c)(1),
(2), (4) Date: Jun. 10, 2013

(87) PCT Pub. No.: WO2012/086111
PCT Pub. Date: Jun. 28, 2012

(65) Prior Publication Data
US 2013/0256648 A1  Oct. 3, 2013

(30) Foreign Application Priority Data
Dec. 20, 2010  (JP) .................. 2010-283115

(51) Int. Cl.
*H01L 33/00* (2010.01)
*H01L 51/00* (2006.01)
*H01L 27/32* (2006.01)
*H01L 51/56* (2006.01)
*H01L 51/52* (2006.01)

(52) U.S. Cl.
CPC ........ *H01L 27/3223* (2013.01); *H01L 27/3246* (2013.01); *H01L 51/56* (2013.01); *H01L 51/5237* (2013.01); *H01L 2227/323* (2013.01)
USPC ................. 257/98; 257/40; 257/E51.018

(58) Field of Classification Search
None
See application file for complete search history.

(56) References Cited

U.S. PATENT DOCUMENTS

2002/0064966 A1  5/2002  Seki et al.
2003/0137242 A1  7/2003  Seki
2003/0140982 A1  7/2003  Seki et al.
(Continued)

FOREIGN PATENT DOCUMENTS

JP  2003-249375  9/2003
JP  2003-282273  10/2003
(Continued)

OTHER PUBLICATIONS

The Extended European Search Report dated Sep. 9, 2013 for the corresponding European Patent Application No. 11850871.2.
(Continued)

*Primary Examiner* — Daniel Luke
(74) *Attorney, Agent, or Firm* — Panasonic Patent Center

(57) ABSTRACT

The present invention provides an organic EL display panel, which has excellent display qualities with no luminance unevenness and emission color unevenness. The present invention provides the organic EL display panel, which has: a TFT panel having an effective light emitting region (L), which is positioned at a center portion, and a dummy region (D), which is positioned at an outer circumferential portion so as to surround the effective light emitting region (L); a plurality of light emitting elements, which are disposed in the effective light emitting region (L); and a plurality of non-light emitting elements, which are disposed in the dummy region (D). A non-light emitting element among the non-light emitting elements, said non-light emitting element being adjacent to the effective light emitting region (L), also has a dummy hole that is provided in the TFT panel.

7 Claims, 12 Drawing Sheets

(56) References Cited

U.S. PATENT DOCUMENTS

| | | |
|---|---|---|
| 2004/0056588 A1 | 3/2004 | Nozawa |
| 2004/0166761 A1 | 8/2004 | Seki et al. |
| 2005/0001542 A1 | 1/2005 | Kiguchi |
| 2005/0140274 A1 | 6/2005 | Lee et al. |
| 2005/0236620 A1 | 10/2005 | Yamada |
| 2005/0264177 A1 | 12/2005 | Chung et al. |
| 2005/0264186 A1 | 12/2005 | Seki et al. |
| 2005/0264187 A1 | 12/2005 | Seki et al. |
| 2005/0266169 A1 | 12/2005 | Seki et al. |
| 2006/0061268 A1 | 3/2006 | Nakanishi |
| 2007/0018152 A1 | 1/2007 | Seki et al. |
| 2008/0315760 A1 | 12/2008 | Seki et al. |
| 2009/0009075 A1 | 1/2009 | Seki et al. |
| 2009/0128020 A1 | 5/2009 | Takei et al. |
| 2009/0302333 A1 | 12/2009 | Seki et al. |
| 2009/0309489 A1 | 12/2009 | Takata et al. |
| 2010/0133993 A1 * | 6/2010 | Pang .................. 313/504 |

FOREIGN PATENT DOCUMENTS

| | | |
|---|---|---|
| JP | 2004-95290 | 3/2004 |
| JP | 3628997 | 12/2004 |
| JP | 2005-93280 | 4/2005 |
| JP | 2005-148335 | 6/2005 |
| JP | 2005-259716 | 9/2005 |
| JP | 2005-310708 | 11/2005 |
| JP | 2005-322639 | 11/2005 |
| JP | 2006-58751 | 3/2006 |
| JP | 2008-47515 | 2/2008 |
| JP | 2009-81097 | 4/2009 |
| JP | 2009-146885 | 7/2009 |
| JP | 2009-199852 | 9/2009 |
| JP | 2010-73602 | 4/2010 |
| JP | 2010-176937 | 8/2010 |

OTHER PUBLICATIONS

International Search Report of PCT Application No. PCT/JP2011/005813 dated Jan. 24, 2012.

* cited by examiner

ORGANIC EL DISPLAY PANEL AND METHOD FOR MANUFACTURING SAME

TECHNICAL FIELD

The present invention relates to an organic EL display panel and a method for manufacturing the same.

BACKGROUND ART

An organic EL display panel is a display panel including a light emitting element which uses electroluminescence of an organic compound. In other words, the organic EL display panel has an EL apparatus which includes a cathode, an anode, and an organic compound which is disposed between both the electrodes and performs electroluminescence. The organic compound which performs electroluminescence may be largely classified into a combination of low-molecular organic compounds (including a host material and a dopant material) and a high-molecular organic compound.

Examples of the high-molecular organic compounds performing electroluminescence include polyparaphenylene vinylene called PPV or derivatives thereof, and the like. An organic EL display panel using the high-molecular organic compound performing electroluminescence can be driven at a relatively low voltage and thus has a feature in which power consumption is low. In addition, the high-molecular organic compound can be provided as ink by dissolving the high-molecular organic compound in an aromatic organic solvent such as xylene or toluene. The providing of ink enables an organic emission layer to be formed using a printing method such as an ink jet method, is regarded as being capable of handling a large-sized screen of a display panel, and is thus currently positively researched and developed.

The organic EL apparatus is a laminate apparatus formed by laminating a plurality of layers such as an electrode, a hole injection layer, and an organic emission layer. A film thickness of each layer is a very important factor in emission characteristics of the organic EL apparatus. Among them, the organic emission layer which directly contributes to emission is required to have high film thickness uniformity. This is because a disparity of the film thickness leads to luminance unevenness or emission color unevenness, and finally leads to poor display quality. For this reason, a technique is known in which an organic emission layer is formed on a planarized ground (for example, refer to PTLs 1 and 2).

When the organic emission layer is formed using a printing method such as an ink jet method, an ink is coated in a region defined by barrier walls called banks, a solvent in the inks is dried so as to form an organic emission layer with a film thickness of about 100 nm. A film shape of the organic emission layer is determined depending on factors such as a coating method, physical properties (the boiling point, a viscosity, and the like) of an ink, physical properties (wettability, film thickness, taper angle, and the like) of a bank, and a drying condition of the organic emission layer ink. Therefore, if the ink drying condition is changed, a film shape of the organic emission layer is also changed.

For example, the concentration of solvent vapor of the ink is low in an outer circumferential portion of the panel, and thus drying of the ink is promoted. Therefore, drying speed of the ink is low in a central portion of the panel, and drying speed of the ink is high in the outer circumferential portion of the panel. For this reason, the organic emission layer of a pixel located on the outer circumferential side of the panel is inclined outward, and thus a film shape worsens (refer to PTL 3). Particularly, if a panel increasingly has a large size, a difference in drying speed becomes notable in the central portion and the outer circumferential portion of the panel, and thus a film shape of the organic emission layer tends to further worsen in the outer circumferential portion of the panel.

In order to solve this problem, a technique is known in which an element (hereinafter, referred to as a "light emitting element") contributing to emission is disposed in the central portion of the panel, and a non-emissive element is disposed in the outer circumferential portion of a substrate (refer to PTLs 4 to 10). The element with a bad film shape in the outer circumferential portion of the panel does not emit light, and only the element in the panel central portion with good thickness uniformity emits light. Thereby, it is possible to provide an organic EL display panel in which luminance unevenness or emission color unevenness is smaller, and thus display quality is better than an organic EL display panel which does not include a non-emissive element.

FIG. 1A is a plan view of an organic EL display panel disclosed in PTL 5, and FIG. 1B is a cross-sectional view taken along the line M-M' of the organic EL display panel shown in FIG. 1A. As shown in FIGS. 1A and 1B, the organic EL display panel disclosed in PTL 5 includes effective emission region A in which light emitting elements 111 are arranged, and dummy region B in which non-emissive elements 111' are arranged. As such, the outer circumferential portion of the panel in which a film shape of an organic functional layer is bad is used as dummy region B, and the central portion of the panel in which a film shape of the organic functional layer is favorable is used as effective emission region A. Thereby, it is possible to provide an organic EL display panel in which there is no luminance unevenness or emission color unevenness, and thus display quality is good.

In addition, as shown in FIG. 1B, light emitting element 111 has a contact hole, but non-emissive element 111' does not have a contact hole.

However, in the organic EL display panel shown in FIG. 1, as disclosed in PTL 5, however large the dummy region was, a film shape of the organic functional layer of the light emitting element located at an edge of the effective emission region could not made to be favorable (refer to Comparative Example).

For this reason, in the organic EL display panel as disclosed in PTL 5, luminance unevenness or emission color unevenness occurs between the light emitting element of the edge of the effective emission region and the other light emitting elements, and thus display quality is low.

On the other hand, an organic EL apparatus is known in which a dummy region where a dummy pixel (non-emissive element) is disposed is provided around an effective emission region where an effective pixel (light emitting element) is disposed, and the dummy pixel is formed in the same manner as the effective pixel except for being electrically non-conducted (refer to PTLs 11 and 12). The dummy pixel of the organic EL apparatus has a contact hole in the same manner as the effective pixel.

The contact hole is formed in a planarized film. The planarized film is generally made of a resin. When moisture is contained in the planarized film through adsorption of the moisture or the like, there are cases where the moisture is diffused into other layers of the organic EL element. In addition, when the moisture enters an emission layer or a charge injection layer, emission characteristics may deteriorate. In the organic EL apparatus in which the contact hole is provided in the dummy pixel in the same manner as the effective pixel, there is a necessity for consideration of the deterioration in the emission characteristics due to diffusion of moisture of the planarized film.

CITATION LIST

Patent Literature

PTL 1: Japanese Patent Application Laid-Open No. 2004-095290
PTL 2: Japanese Patent Application Laid-Open No. 2005-093280
PTL 3: Japanese Patent Application Laid-Open No. 2010-73602
PTL 4: Japanese Patent No. 3628997
PTL 5: Japanese Patent Application Laid-Open No. 2005-259716
PTL 6: Japanese Patent Application Laid-Open No. 2005-310708
PTL 7: Japanese Patent Application Laid-Open No. 2009-081097
PTL 8: U.S. Patent Application Laid-Open No. 2005/0140274
PTL 9: U.S. Patent Application Laid-Open No. 2005/0264177
PTL 10: Japanese Patent Application Laid-Open No. 2003-249375
PTL 11: Japanese Patent Application Laid-Open No. 2009-146885
PTL 12: U.S. Patent Application Laid-Open No. 2009/0128020

SUMMARY OF INVENTION

Technical Problem

The present invention has been made in consideration of these circumstances, and an object thereof is to provide an organic EL display panel in which a film shape of a functional layer of a light emitting element at an edge of an effective emission region is favorable, there is no luminance unevenness or emission color unevenness, display quality is favorable, and deterioration in emission characteristics is further suppressed.

Solution to Problem

As a result of thorough study, the present inventor has found that a poor film shape of the functional layer of the light emitting element at the edge of the effective emission region is because the light emitting element at the edge of the effective emission region has a bank with a different shape. In addition, it has been found that the reason why the light emitting element at the edge of the effective emission region has a bank with a different shape is that an adjacent non-emissive element does not have a contact hole (refer to Comparative Example). Further, it has been found that to form a hole corresponding to a contact hole in a non-emissive element at a specific position is effective to suppress deterioration in emission characteristics of a light emitting element.

In other words, a first aspect of the invention relates to an organic EL display panel described in the following.

[1] An organic EL display panel including: a TFT panel that includes an effective emission region located at a central portion and a dummy region located in an outer circumferential portion and surrounding the effective emission region; a plurality of light emitting elements disposed in the effective emission region; and a plurality of non-emissive elements disposed in the dummy region, wherein each of the light emitting elements includes a thin film transistor embedded in the TFT panel; a contact hole provided at one end side of a region of the light emitting element in the TFT panel; a pixel electrode provided on the TFT panel and connected to the thin film transistor via the contact hole; an organic functional layer disposed on the pixel electrode; a bank disposed on the TFT panel and defining a disposition region of the organic functional layer; and a counter electrode disposed on the organic functional layer, wherein the non-emissive element includes a bank disposed on the TFT panel; and an organic functional layer formed in a region defined by the bank, wherein, among the plurality of non-emissive elements, a only non-emissive element further includes a hole which is provided at one end side of a region of the only non-emissive element, the only non-emissive element being adjacent to the light emitting element at the other end side of the region of the light emitting element.

[2] The organic EL display panel set forth in [1], wherein, among the plurality of non-emissive elements, the non-emissive element adjacent to the effective emission region further includes a thin film transistor embedded in the TFT panel, and wherein the thin film transistor of the non-emissive element does not function.

[3] The organic EL display panel set forth in [1] or [2], wherein, among the plurality of non-emissive elements, the non-emissive element adjacent to the effective emission region further includes a pixel electrode disposed on the TFT panel.

[4] The organic EL display panel set forth in any one of [1] to [3], wherein, among the plurality of non-emissive elements, the non-emissive element adjacent to the effective emission region does not have a counter electrode.

[5] The organic EL display panel set forth in any one of [1] to [4], wherein the bank surrounds the element on all sides.

[6] The organic EL display panel set forth in any one of [1] to [4], wherein the bank defines the elements arranged in a line.

A second aspect of the present invention relates to a method for manufacturing an organic EL display panel described in the following.

[7] A method for manufacturing the organic EL display panel set forth in any one of [1] to [6], including: preparing the TFT panel by forming a planarized film on a substrate provided with a thin film transistor; forming the contact hole in the planarized film at one end side of the region of the light emitting element, and forming the hole in the planarized film at one end side of the region of a only non-emissive element, the only non-emissive element being adjacent to the light emitting element at the other end side of the region of the light emitting element; forming a pixel electrode in the effective emission region of the TFT panel; forming the bank on the TFT panel; coating and forming the organic functional layer in the region defined by the bank; and forming the counter electrode in the effective emission region of the TFT panel.

Advantageous Effects of Invention

According to the organic EL display panel and the method for manufacturing the same of the present invention can make a film shape of the organic functional layer of the light emitting element at an edge of the effective emission region favorable. In addition, it is possible to reduce the number of the contact holes and the holes formed in the planarized film and to thereby make the surface area of the planarized film as small as possible. Therefore, it is possible to further suppress absorption of moisture in the planarized film and diffusion of moisture from the planarized film into other layers. For this reason, the organic EL display panel of the present invention can achieve small luminance unevenness and emission color unevenness and high display quality, and can further suppress deterioration in emission characteristics.

DESCRIPTION OF EMBODIMENTS

1. Organic EL Display Panel of Present Invention

An organic EL display panel of the present invention is an active matrix type organic EL display panel in which each organic EL element is driven by a thin film transistor independently. In addition, the organic EL display panel of the present invention is a wet type organic EL display panel in which an organic functional layer of each organic EL element is formed using a coating method. The organic EL display panel of the present invention may be of a top emission type or a bottom emission type.

The organic EL display panel of the present invention has a TFT panel in which subpixels are disposed in a matrix. The TFT panel has a thin film transistor (hereinafter, referred to as a "TFT"). The TFT panel includes a substrate, a TFT disposed on the substrate, and a planarized film covering the substrate and the TFT.

Materials of the substrate of the TFT panel are different depending on whether the display panel is of a bottom emission type or a top emission type. For example, in a case where the display panel is of a bottom emission type, the substrate is required to be transparent, and thus materials of the substrate may use glass, a transparent resin, or the like. On the other hand, in a case where the display panel is of a top emission type, the substrate is not required to be transparent, and thus materials of the substrate may use any insulating material.

The planarized film reduces unevenness due to the TFT disposed on the substrate so as to planarize a surface of the TFT panel. The thickness of the planarized film is typically 3 μm to 10 μm, and may be about 5 μm. Materials of the planarized film may be an organic material such a resin, or an inorganic material such as $SiO_2$. A contact hole which connects a pixel electrode described later to a source or drain electrode of a driving TFT is formed in the planarized film.

The TFT panel includes an effective emission region located in a central portion of the TFT panel and a dummy region which is located in an outer circumferential portion of the TFT panel and surrounds the effective emission region. A plurality of light emitting elements (subpixels) are disposed in the effective emission region in a matrix. In addition, a plurality of non-emissive elements are disposed in the dummy region.

As such, in the present invention, the outer circumferential portion of the TFT panel where a film shape of the organic functional layer tends to worsen is used as a non-emissive region (dummy region), and the central portion of the TFT panel where a film shape of the organic functional layer is favorable is used as an effective emission region. Thereby, it is possible to provide an organic EL display panel in which there is no luminance unevenness or emission color unevenness and display quality is good.

Figure 2:
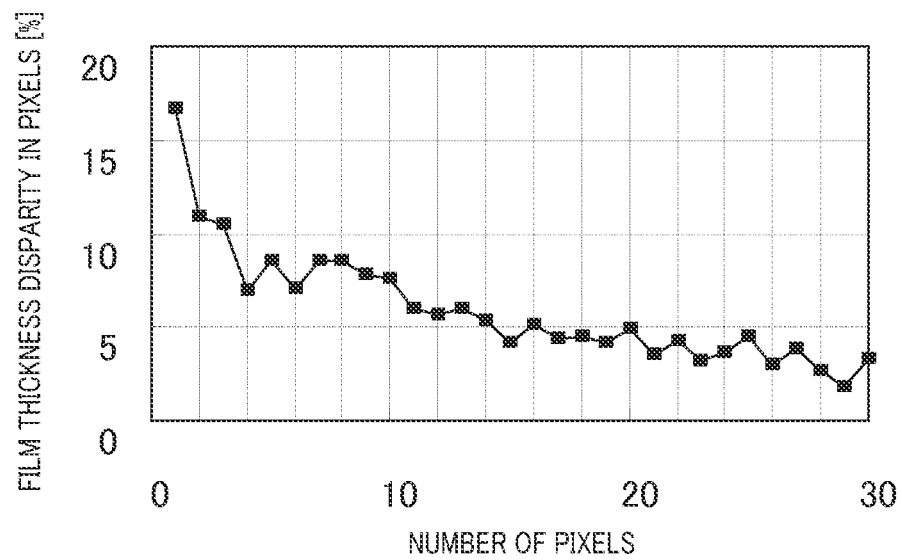
FIG. 2 is a graph illustrating variations in uniformity of a film shape of an organic functional layer from an edge of the panel.

FIG. 2 is a graph illustrating uniformity of a film shape of an organic functional layer of each element in an organic EL display panel in which the organic functional layer is formed using a coating method. The transverse axis of the graph of FIG. 2 expresses a position from the edge of the organic EL display panel. For example, the unit 10 of the transverse axis indicates ten elements from the edge of the organic EL display panel. The longitudinal axis of the graph of FIG. 2 expresses an extent of a disparity between film thicknesses of the organic functional layers in the elements. The larger value of the longitudinal axis indicates a worse film shape. As shown in FIG. 2, a film shape of the functional layer of the element is not good around the edge of the organic EL display panel, and a film shape of the functional layer of the element is favorable in the central portion of the organic EL display panel.

The size of the dummy region is not particularly limited, and, preferably includes elements of two to ten columns from the edge of the organic EL display panel, more preferably includes elements of two to five columns, and includes, for example, elements of three columns. As shown in FIG. 2, the film thickness disparity of the organic functional layer becomes 10% or less in the fourth or more element from the edge of the organic EL display panel. For this reason, the dummy region includes the elements of three columns from the edge of the organic EL display panel, and thereby the film thickness disparity of the organic functional layer can be suppressed to 10% or less in the effective emission region. Next, the light emitting element and the non-emissive element will be described.

(1) Light Emitting Element

The light emitting element includes a TFT embedded in the TFT panel, a contact hole provided in the TFT panel, a pixel electrode disposed on the TFT panel, an organic functional layer disposed on the pixel electrode, a bank partitioning a disposition region of the organic functional layer, and a counter electrode disposed on the organic functional layer.

The TFT is a apparatus for driving the element. The TFT includes a source electrode, a drain electrode, a channel which connects the source electrode to the drain electrode, and a gate electrode controlling the channel. In the present invention, the TFT may be a silicon-based TFT or an organic-based TFT.

The contact hole is a hole provided in the planarized film of the TFT panel. An interconnection which connects the source electrode or the drain electrode of the TFT to the pixel electrode is provided in the contact hole. The contact hole is formed at one end side of the region of the light emitting element in the TFT panel from the viewpoint of realizing a wider emission region in the light emitting element. For example, in a case where the light emitting element has a thin and long shape such a rectangular shape, the contact hole is preferably disposed at one end side in a longitudinal direction of the region of the light emitting element from the above-described viewpoint. The dimension of the contact hole is not particularly limited, and, for example, the width thereof is 5 µm to 20 µm, and the depth thereof is 4 µm to 5 µm. In addition, in the present invention, the contact hole may be of a reverse cone type. Here, the "reverse cone type" indicates that the diameter of an opening on the pixel electrode side is greater than the diameter of an opening on the TFT side. Specifically, it is preferable that the diameter of the opening of the contact hole on the pixel electrode side be 20 µm to 10 µm, and the diameter of the opening on the TFT side be 5 µm to 15 µm.

The pixel electrode is a conductive layer disposed on the planarized film of the TFT panel. The pixel electrode typically functions as an anode, but may function as a cathode. The thickness of the pixel electrode is typically 100 nm to 500 nm, and may be about 150 nm. Materials of the pixel electrode are different depending on whether the display panel is of a bottom emission type or a top emission type. In a case where the display panel is of a top emission type, the pixel electrode is required to be a transparent electrode, and thus materials of the pixel includes ITO (Indium Tin Oxide), IZO (Indium Zinc Oxide), tin oxide, and the like.

On the other hand, in a case where the display panel is of a top emission type, since the pixel electrode is required to reflect light, materials of the pixel electrode include an alloy including silver, more specifically, a silver-palladium-copper alloy (also referred to as APC), a silver-rubidium-gold alloy (also referred to as ARA), a molybdenum-chromium alloy (also referred to as MoCr), a nickel-chromium alloy (also referred to as NiCr), an aluminum alloy, and the like.

The pixel electrode is connected to the source electrode or the drain electrode of the TFT via the contact hole provided in the TFT panel. In addition, a hole injection layer may be provided on the pixel electrode. The hole injection layer is a layer of assisting injection of holes into the organic functional layer described later from the pixel electrode. For this reason, the hole injection layer is disposed between the pixel electrode and the organic functional layer.

Examples of materials of the hole injection layer include poly(3,4-ethylenedioxythiophene) doped with polystyrene sulfonic acid (called PEDOT-PSS), oxides of transition metals, and the like; however, materials of the hole injection layer are preferably oxides of transition metals. The hole injection layer made of PEDOT is unlikely to have a uniform film thickness since the hole injection layer is formed using a coating method. In addition, PEDOT is conductive, and thus there is great concern that the organic EL element may be short-circuited. On the other hand, the hole injection layer made of oxides of transition metals has a uniform film thickness since the hole injection layer is formed using a sputtering method.

Examples of transition metals include tungsten, molybdenum, titanium, vanadium, ruthenium, manganese, chromium, nickel, and iridium, and combinations thereof. A preferable material of the hole injection layer is tungsten oxide (WOx) or molybdenum oxide (MoOx). The thickness of the hole injection layer is typically 10 nm to 100 nm, and may be about 30 nm. In addition, the hole injection layer may be omitted as long as holes are efficiently injected into the organic functional layer from the pixel electrode.

The organic functional layer is a layer which includes at least the organic functional layer and is disposed on the pixel electrode. The organic functional layer is formed by coating a material liquid of the organic functional layer in a region defined by the banks. The material liquid (an ink in which a material of the organic functional layer is dissolved in an organic solvent such as anisole or cyclohexyl benzene) of the organic functional layer is coated using a coating method such as an ink jet method, and thereby the organic functional layer can be easily formed without damaging other materials.

An organic EL material included in the organic emission layer may be a high-molecular material or a low-molecular material as long as the organic emission layer can be formed using a coating method.

The low-molecular organic EL material includes a combination of a dopant material and a host material. Examples of the dopant material BCzVBi (4,7-diphenyl-1,10-phenanthroline), coumarin, rubrene, DCJTB ([2-tert-butyl-6-[2-(2,3,6,7-tetrahydro-1,1,7,7-tetramethyl-1H,5H-benzo[ij]quinolizine-9-yl)vinyl]-4H-pyran-4-ylidene]malononitrile), and the like, and examples of the host material include DPVBi (4,4'-bis(2,2-diphenylethenyl)biphenyl), Alq3 (tris(8-quinolinolato)aluminum), and the like.

Examples of the high-molecular organic EL material include polyphenylenevinylene and derivatives thereof, polyacetylene and derivatives thereof, polyphenylene and derivatives thereof, polyparaphenylene ethylene and derivatives thereof, poly 3-hexyl thiophene (P3HT) and derivatives thereof, polyfluorence (PF) and derivatives thereof, and the like. Since the organic emission layer including the high-molecular organic EL material is easily formed using a coating method, and an organic EL material included in the organic emission layer is the high-molecular organic EL material.

The organic EL material is appropriately selected such that each light emitting element emits desired color light (red R, green G, and blue B). For example, a green light emitting element is disposed around a red light emitting element, a blue light emitting element is disposed around the green light emitting element, and the red light emitting element is disposed around the blue light emitting element. In addition, the thickness of the organic functional layer is preferably about 50 nm to 150 nm (for example, 60 nm).

The organic functional layer may further include a hole transport layer (inter-layer), an electron transport layer, and the like. The hole transport layer is a layer which plays a role of blocking electrons entering the pixel electrode or the hole injection layer or of efficiently transporting holes to the organic emission layer, and is made of polyaniline-based materials. Therefore, the hole transport layer is disposed between the pixel electrode or the hole injection layer and the organic emission layer. The thickness of the hole transport layer is typically 10 nm or more and 100 nm or less, and is preferably about 30 nm. In addition, as long as holes can be efficiently transported to the organic emission layer, the hole transport layer may be omitted.

The bank is member which defines a disposition region of the organic functional layer. The bank is disposed on the substrate. The height of the bank from the surface of the bank is preferably 0.1 µm to 3 µm, and more preferably 0.8 µm to 1.2 μm. If the height of the bank is greater than 3 μm, there is concern that a single counter electrode shared by all the light emitting elements may be divided by the bank. In addition, if the height of the bank is smaller than 0.1 μm, there is concern that an ink coated in a region defined by the bank leaks out of the bank.

In addition, a shape of the bank is a forward taper shape. The forward taper shape indicates that a wall surface of the bank is tilted, and a tilt angle (taper angle) of the wall surface of the bank is equal to or less than 90°. When a shape of the bank is a taper shape, a taper angle is 20° to 80°, and is preferably, particularly 30° to 50°. If the taper angle of the bank is greater than 80°, there is concern that a single counter electrode shared by all the light emitting elements may be divided by the bank.

A material of the bank is not particularly limited as long as it is a resin, but preferably includes a fluorine-containing resin. Examples of fluorine compounds included in the fluorine-containing resin include vinylidene fluoride, vinyl fluoride, ethylene trifluoride, a fluoride resin such as a copolymer thereof, and the like. In addition, examples of resins included in the fluorine-containing resin include phenol-novolak resins, polyvinyl phenol resins, acrylic resins, methacrylic resins, and combinations thereof.

Further specific examples of the fluorine-containing resins include LUMIFLON (registered trademark, manufactured by ASAHI GLASS CO., LTD.) which is a copolymer of fluorine-containing polymer (fluoroethylene) and vinyl ether disclosed in, for example, Japanese Translation of a PCT Application Laid-Open No. 2002-543469, and the like.

The wettability of the wall surface of the bank is low. In addition, the wettability of the upper portion of the bank wall surface is preferably lower than the wettability of the lower portion of the bank wall surface. A contact angle of the upper portion of the bank wall surface with water is 80° or more, and preferably 90° or more, and a contact angle of the upper portion of the bank wall surface with anisole is preferably 30° to 70°. On the other hand, a contact angle of the lower portion of the bank wall surface with anisole is preferably 3° to 30°. The higher contact angle indicates that the wettability is lower.

The bank may surround an element on all sides (refer to Embodiments 1 to 4), or may surround elements (refer to Embodiment 5) arranged in a line.

The counter electrode is a conductive member disposed on the organic functional layer. The counter electrode typically functions as a cathode but may function as an anode. Materials of the counter electrode are different depending on whether the organic EL display panel is of a bottom emission type or a top emission type. In a case of the top emission type, the counter electrode is required to be transparent, and thus examples of the materials of the counter electrode include ITO, IZO, and the like. In addition, in a case of the top emission type, an organic buffer layer may be disposed between the organic functional layer and the counter electrode.

On the other hand, in a case of the bottom emission type, the counter electrode is not required to be transparent. Therefore, materials of the counter electrode may include any conductive materials. Examples of the materials of the counter electrode include barium (Ba), barium oxide (BaO), aluminum (Al), and the like.

The counter electrode is typically formed through sputtering. In addition, all the light emitting elements included in the organic EL display panel may share a single counter electrode. The counter electrode shared by all the light emitting elements included in the organic EL display panel is also referred to as a common electrode. The common electrode covers not only the organic functional layer but also the bank (refer to FIG. 3B).

(2) Non-Emissive Element

The non-emissive element at least includes a bank disposed on the TFT panel and an organic functional layer formed in a region defined by the bank. The non-emissive element may further include a TFT, a pixel electrode, and an counter electrode.

The present invention is characterized in that, among the non-emissive elements, a non-emissive element (hereinafter, referred to as a "boundary non-emissive element") which is adjacent to the light emitting element at least on the other side of the light emitting element has a hole (hereinafter, referred to as a "dummy hole") provided in the planarized film of the TFT panel.

The dimension (the width and the depth) of the contact hole of the boundary non-emissive element is preferably the same as the dimension of the contact hole of the light emitting element. In addition, a relative position of the dummy hole in the boundary non-emissive element is preferably the same as a relative position of the contact hole in the light emitting element. Here, the "relative position" indicates a position of the hole with respect to the center of the element. In other words, the TFT panel has the hole at one end side of the region of the boundary non-emissive element.

As above, the boundary non-emissive element has the dummy hole formed in the planarized film of the TFT panel, and thereby it is possible to suppress a disparity between film shapes of the organic functional layers of the light emitting elements (hereinafter, referred to as a "boundary light emitting elements") located at the edge of the effective emission region and the other light emitting elements. Hereinafter, a description will be made of a relationship between to provide the dummy hole in the boundary non-emissive element and to suppress a disparity between film shapes of the organic functional layers of the light emitting elements.

Figure 1A:
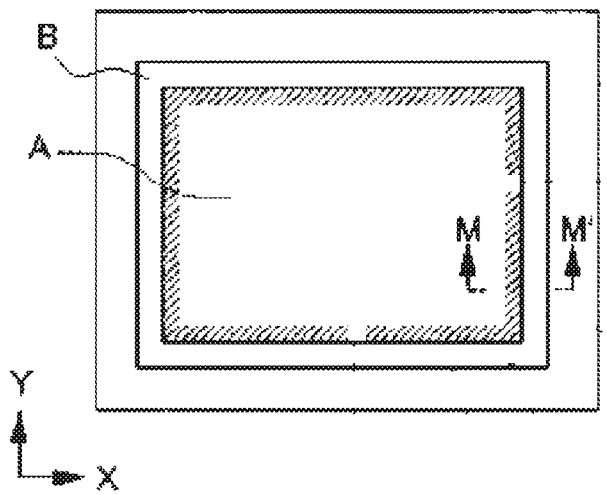
FIGS. 1A and 1B are a plan view and a cross-sectional view, respectively, of an organic EL display panel in the related art.
Figure 1B:
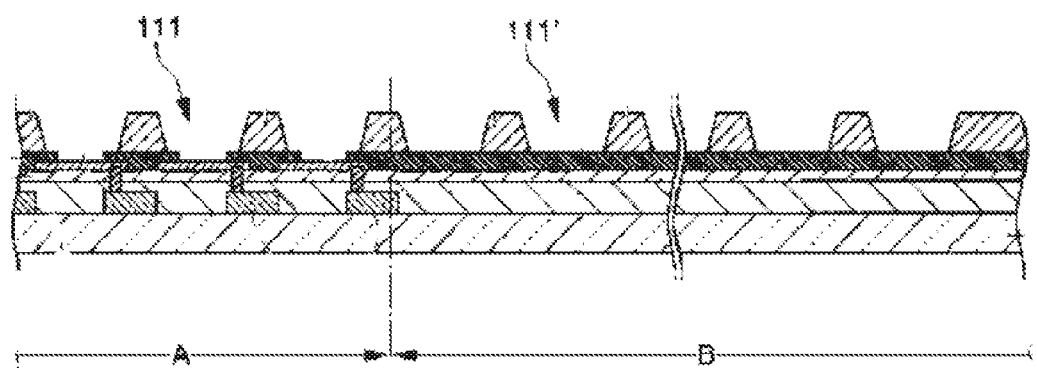

As in the related art, in an organic EL display panel in which the non-emissive element does not have a contact hole (refer to FIG. 1), there is a difference between patterns of the banks of the boundary light emitting elements and patterns of the banks of the other light emitting elements. More specifically, among the banks of the boundary light emitting elements, shapes of banks (hereinafter, also referred to as "boundary banks") forming a boundary between the effective emission region and the dummy region is different from shapes of the banks (hereinafter, also referred to as "internal banks of the effective emission region") of the other light emitting elements (refer to FIG. 12A).

Figure 4:
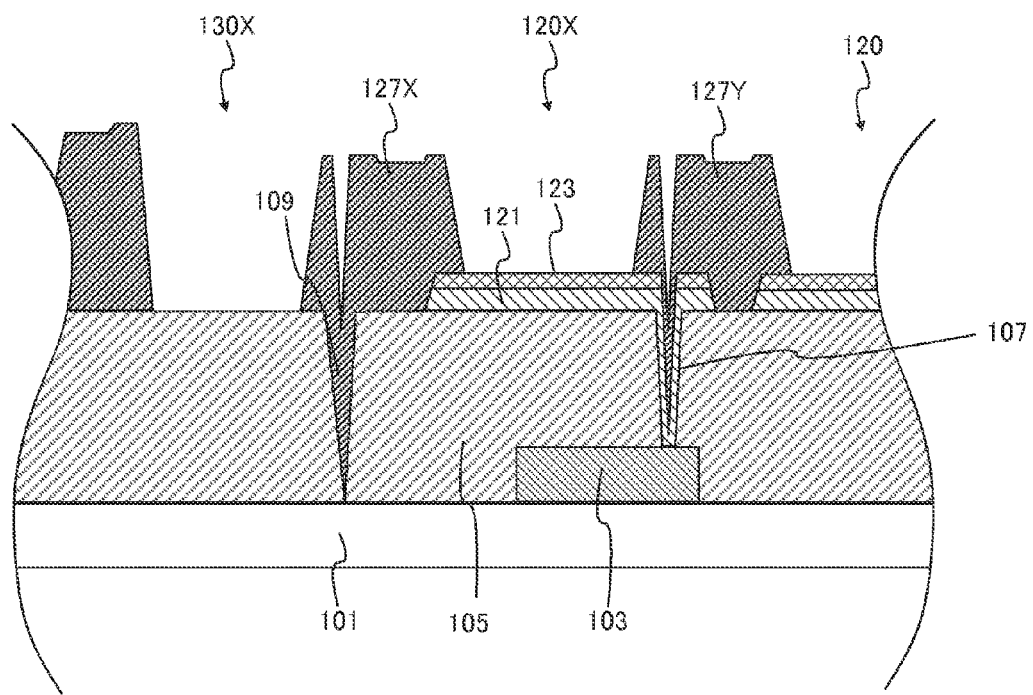
FIG. 4 is a partially enlarged view of the cross-sectional view of the organic EL display panel according to Embodiment 1.

This is because shapes of the banks depends on the ground of the banks, that is, an uneven shape of the surface of the planarized film of the TFT panel (refer to FIG. 4), and, further, the uneven shape of the planarized film depends on whether or not there is the hole of the adjacent hole (the contact hole or the dummy hole) (FIG. 4). In other words, this is because the light emitting element partitioned by the internal bank of the effective emission region has the contact hole, but, on the other hand, the boundary bank also partitions the non-emissive element which does not have the contact hole.

In addition, a shape of the organic functional layer formed through coating is influenced by a shape of the bank which defines a region in which a material liquid of the organic functional layer is coated. For this reason, if patterns of the banks of the boundary light emitting elements are different from patterns of the banks of the other light emitting elements as in the organic EL display panel in the related art, film shapes of the organic functional layers of the boundary light emitting elements are different from film shapes of the organic functional layers of the other light emitting elements.

On the other hand, in the present invention, the boundary non-emissive element has the dummy hole formed in the planarized film of the TFT panel, and thus all the elements partitioned by the boundary banks have holes in the same manner as in the internal elements of the effective emission region. For this reason, in the present invention, shapes of the boundary banks are the same as shapes of the internal banks of the effective emission region (refer to FIG. 11A). Therefore, in the present invention, a bank pattern disparity is small between the boundary light emitting elements and the other light emitting elements. For this reason, in the present invention, a disparity of film shapes of the organic functional layers is small between the boundary light emitting elements and the other light emitting elements. Thereby, it is possible to provide an organic EL display panel which has small luminance unevenness and emission color unevenness and thus has good emission characteristics.

In addition, in the present invention, since the boundary non-emissive element has the dummy hole, a non-emissive element other than the boundary non-emissive element does not have a dummy hole. Therefore, the number of contact holes and dummy holes formed in the planarized film can be set to the minimum number capable of achieving the pattern disparity suppression effect. Thereby, it is possible to provide an organic EL display panel in which adsorption of moisture to the planarized film or deterioration in emission characteristics due to diffusion of moisture absorbed in the planarized film into other layers is further suppressed.

2. Method for Manufacturing Organic EL Display Panel of Present Invention

The organic EL display panel of the present invention may be manufactured using any method as long as the method does not harm the effects of the present invention.

A preferable example of the method for manufacturing the organic EL display panel of the present invention includes
1) a first step of preparing a TFT panel;
2) a second step of forming a contact hole and a dummy hole in the TFT panel;
3) a third step of forming a pixel electrode in an effective emission region of the TFT panel;
4) a fourth step of forming a bank on the TFT panel; and
5) a fifth step of coating a material liquid of an organic functional layer in a region defined by the bank so as to form the organic functional layer. Hereinafter, each step will be described.

1) In the first step, a TFT panel is prepared. The TFT panel is manufactured, for example, by manufacturing a TFT on a substrate and disposing a planarized film on the substrate on which the TFT is manufactured.

When the TFT is formed on the substrate, layers such as a gate electrode, a gate insulating film, a source electrode, a drain electrode, a semiconductor film, and a passivation film may be formed on the substrate using a sputtering method or a photolithography method.

In addition, the planarized film may be formed: by forming a film made of a photosensitive resin and then curing the film, or by forming a film made of an inorganic material such as SiO$_2$ through sputtering.

2) In the second step, a contact hole and a dummy hole are formed in the TFT panel. Specifically, a contact hole is formed in the planarized film of the TFT panel of the effective emission region, and a dummy hole is formed in the planarized film of the TFT panel of a region where a boundary non-emissive element is formed in the dummy region. The contact hole and the dummy hole formed in the planarized film may be formed using a photolithography method or etching.

3) In the third step, a pixel electrode is formed in the effective emission region of the TFT panel. In relation to the pixel electrode, for example, a film made of a material of the pixel electrode may be formed on the TFT panel using a deposition method or a sputtering method, and the formed film may be patterned in a desired shape.

4) In the fourth step, a bank is formed. The bank is formed, for example, in photolithography processes (coating, baking, exposing, developing, and calcining). When the bank is formed in the photolithography processes in this way, a shape of the bank is influenced by an uneven shape of the ground (the planarized film) on which the bank is formed. In addition, the uneven shape of the planarized film is also influenced by the hole of the adjacent element.

5) In the fifth step, a material liquid of the organic functional layer is coated in the region defined by the bank. The coated material liquid includes a desired material of the organic functional layer and a solvent. Examples of the solvent include an aromatic solvent such as anisole. Coating means is not particularly limited. Examples of the coating means include ink jet, dispenser, nozzle coating, spin coating, die coating, intaglio printing, relief printing, and the like. As the coating means, the ink jet is preferably used.

Specifically, the material liquid of the organic functional layer is coated in both of the effective emission region and the dummy region. In addition, the coated material liquid is dried and baked so as to form the organic functional layer. As above, by coating the material liquid of the organic functional layer in both of the effective emission region and the dummy region, an organic functional layer with a bad film shape is formed in the dummy region, but an organic functional layer with a good film shape can be formed in the effective emission region.

In addition, in the present embodiment, the bank shapes of the boundary light emitting elements are same as those of other light emitting elements, and thus it is possible to form an organic functional layer with a good film shape even in the boundary light emitting element.

Hereinafter, embodiments of the present invention will be described with reference to the drawings, but the scope of the present invention is not limited to the following embodiments.

(Embodiment 1)

In Embodiment 1, a top emission type organic EL display panel will be described.

Figure 3A:
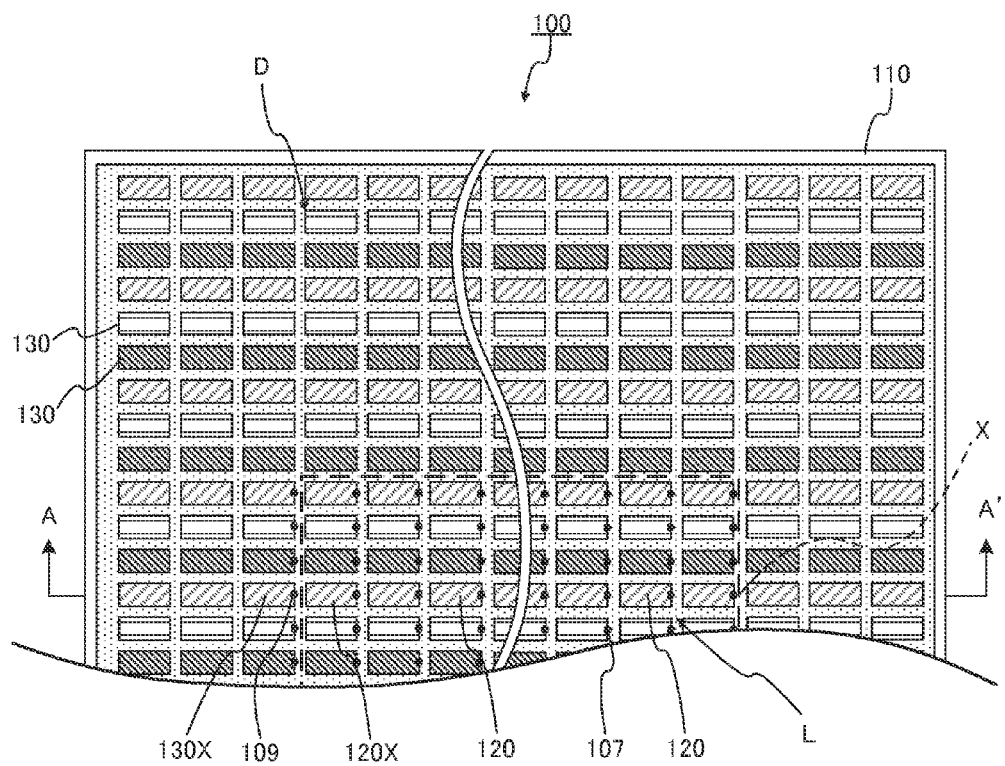
FIGS. 3A and 3B are a plan view and a cross-sectional view, respectively, of an organic EL display panel according to Embodiment 1.
Figure 3B:
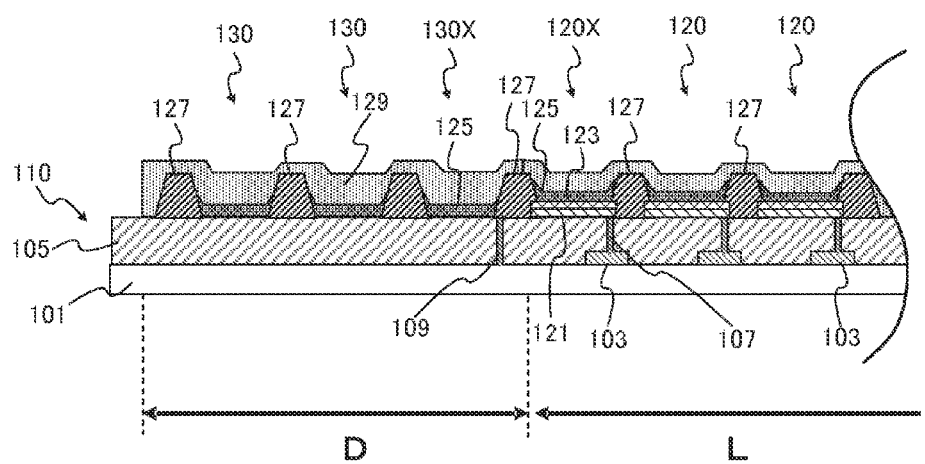

FIG. 3A is a partially enlarged view of a plane of organic EL display panel 100 of Embodiment 1, and FIG. 3B shows main portions in a cross-sectional view taken along the line AA' of organic EL display panel 100 shown in FIG. 3B.

As shown in FIGS. 3A and 3B, organic EL display panel 100 includes TFT panel 110 in which elements (subpixels) are disposed in a matrix arrangement. TFT panel 110 includes effective emission region L where light emitting elements 120 are arranged and dummy region D where non-emissive elements 130 are arranged.

As shown in FIG. 3B, TFT panel 110 includes a substrate 101, TFTs 103 disposed on substrate 101, planarized film 105 disposed on substrate 101 and TFTs 103, and contact holes 107 and dummy hole 109 formed in planarized film 105.

Light emitting element 120 includes TFT 103, contact hole 107, reflective anode (pixel electrode) 121, hole injection layer 123, organic emission layer 125, bank 127, and transparent cathode (counter electrode) 129. Contact hole 107 is located at one end side in a long axis direction of light emitting element 120.

Reflective anode 121 is made of, for example, an APC alloy. The thickness of reflective anode 121 is preferably 100 nm to 200 nm.

Hole injection layer 123 is disposed on reflective anode 121. Hole injection layer 123 is made of tungsten oxide (WOx). The thickness of hole injection layer 123 is preferably 5 nm to 30 nm.

Organic emission layer 125 is disposed on hole injection layer 123. The thickness of organic emission layer 125 is preferably 50 nm to 150 nm. Organic emission layer 125 is made of a derivative of polyfluoren.

Bank 127 is disposed on hole injection layer 123 so as to expose a part of hole injection layer 123. In the present embodiment, bank 127 surrounds light emitting element 120 on all sides. The height of bank 127 from hole injection layer 123 is preferably 200 nm to 3 µm.

Transparent cathode 129 is a conductive layer which transmits light therethrough and is disposed on organic emission layer 125. A material of transparent cathode 129 is, for example, ITO.

Non-emissive element 130 includes hole injection layer 123, organic emission layer 125, and transparent cathode 129. In addition, among non-emissive elements 130, non-emissive element (boundary non-emissive element) 130X has dummy hole 109, non-emissive element 130X being adjacent to effective emission region L at the other end side of effective emission region L. Dummy hole 109 is located at one end side in the long axis direction of non-emissive element 130 in the same manner as contact hole 107. As above, a relative position of dummy hole 109 in non-emissive element 130 is the same as a relative position of contact hole 107 in light emitting element 120.

FIG. 4 is a partially enlarged view of the organic EL display panel shown in FIG. 3B. As shown in FIG. 4, in the present embodiment, a part of internal bank 127Y of the effective emission region is formed on the contact hole, and thus a part of bank 127Y becomes recessed by being influenced by contact hole 107 of adjacent light emitting element 120. In addition, in the present invention, dummy hole 109 is also provided in boundary non-emissive element 130X, and thus boundary bank 127X (refer to sign X of FIG. 3A) forming a boundary between effective emission region L and the dummy region is also recessed by being influenced by dummy hole 109. For this reason, in the present embodiment, a disparity between a shape of boundary bank 127X and bank 127Y is small.

As above, according to the present embodiment, since a shape of the boundary bank 127X is the same as a shape of internal bank 127Y, a film shape of organic emission layer 125 of boundary light emitting element 120X can be made to be favorable.

When a voltage is applied between reflective anode 121 and transparent cathode 129 of organic EL display panel 100, holes from reflective anode 121 and electrons from transparent cathode 129 are injected into organic emission layer 125. The injected holes and electrons are combined inside organic emission layer 125 so as to generate excitons. Organic emission layer 125 emits light by the excitons, and thus the light is emitted through transparent cathode 129.

Next, with reference to FIGS. 5A to 5E, a method for manufacturing organic EL display panel 100 of the present embodiment will be described. As shown in FIGS. 5A to 5E, the method for manufacturing organic EL display panel 100 includes 1) a first step of preparing TFT panel 110 (FIG. 5A), 2) a second step of forming reflective anode 121 and hole injection layer 123 on effective emission region L of TFT panel 110 (FIG. 5B), 3) a third step of forming bank 127 on TFT panel 110 (FIG. 5C), 4) a fourth step of forming organic emission layer 125 in a region defined by bank 127 through coating (FIG. 5D), and 5) a fifth step of forming transparent cathode 129 so as to cover organic emission layer 125 and bank 127 (FIG. 5E).

Figure 5A:
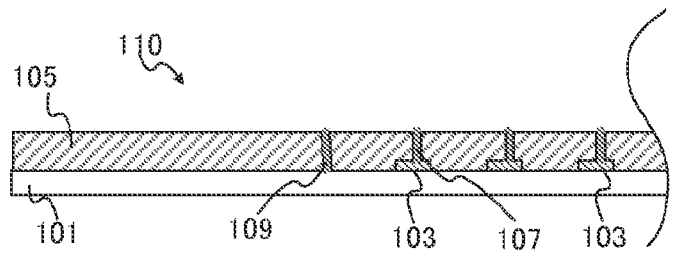
FIGS. 5A, 5B, 5C, 5D and 5E are diagrams illustrating a manufacturing flow of the organic EL display panel according to Embodiment 1.

1) FIG. 5A shows the first step. As shown in FIG. 5A, in the first step, TFT panel 110 is prepared. Planarized film 105 is formed on substrate 101 provided with TFTs 103 disposed in the regions of the light emitting elements, contact hole 107 is formed at a position at one end side of each light emitting element, and dummy hole 109 is formed at a position at one end side of the boundary non-emissive element.

Figure 5B:
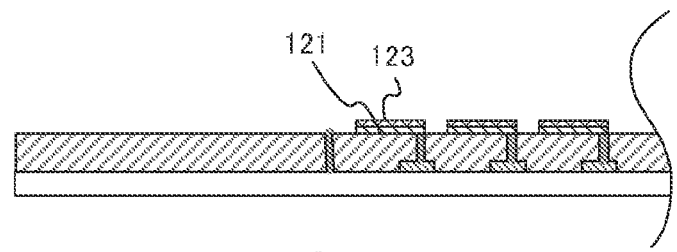

2) FIG. 5B shows the second step. As shown in FIG. 5B, in the second step, reflective anodes 121 and hole injection layers 123 are formed on effective emission region L of TFT panel 110. In relation to reflective anode 121, for example, a film made of a material of reflective anode 121 may be formed on TFT panel 110 by using a deposition method or a sputtering method, and the formed film may be patterned in a desired shape. Similarly, also in relation to hole injection layer 123, a film made of a material of hole injection layer 123 may be formed on TFT panel 110 by using a deposition method or a sputtering method, and the formed film may be patterned in a desired shape.

Figure 5C:
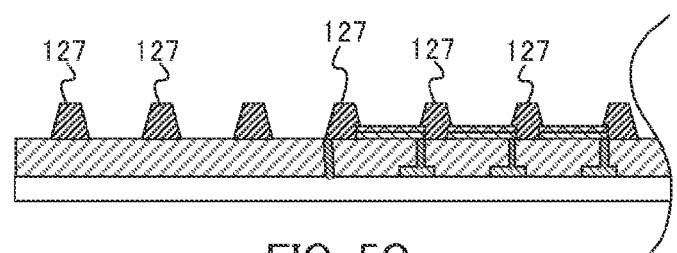

3) FIG. 5C shows the third step. As shown in FIG. 5C, in the third step, bank 127 is formed on TFT panel 110. Bank 127 is formed, for example, in a photolithography method. Specifically, a coated bank material is pre-baked, exposed, developed, and post-baked so as to form bank 127. Conditions of the photolithography method are not particularly limited, and may include, for example, pre-baking for two minutes at 100° C.; setting irradiation rays with a main peak of 365 nm as irradiation light; setting an irradiation amount to an exposure amount of 200 mJ/cm$^2$; development with TMAH of 0.2% for sixty seconds; post-baking for sixty minutes in a clean oven of 220° C. In addition, bank 127 is formed on effective emission region L of TFT panel 110 so as to expose at least a part of hole injection layer 123.

Figure 5D:
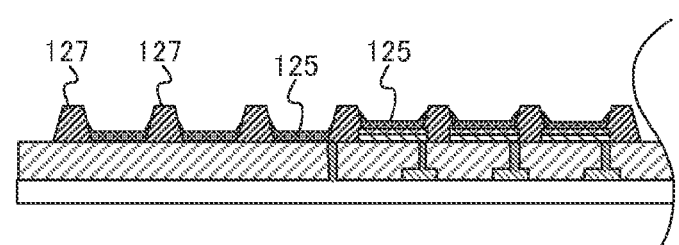
Figure 5E:
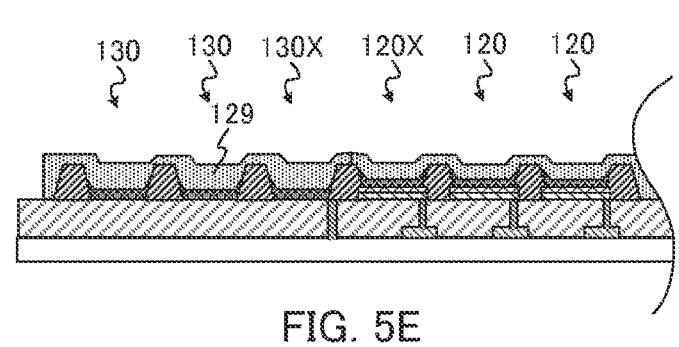

4) FIG. 5D shows the fourth step. As shown in FIG. 5D, a material liquid of organic emission layer 125 is coated in the region defined by bank 127, for example, by using an ink jet method. The material liquid of organic emission layer 125 coated using the ink jet method is dried and is baked. The drying is performed, for example, in a vacuum chamber while reducing a pressure. The reduction in a pressure is performed until a pressure reaches about 5 Pa. A temperature during the drying is 25° C. The baking is performed, for example, using a hot plate of 130° C. for ten minutes.

FIG. 5E shows the fifth step. As shown in FIG. 5E, in the fifth step, transparent cathode 129 is formed so as to cover organic emission layer 125 and bank 127. Transparent cathode 129 is formed, for example, using a deposition method.

(Embodiment 2)

In Embodiment 1, a configuration in which the non-emissive element does not have a TFT has been described. In Embodiment 2, a configuration in which the non-emissive element has a TFT will be described.

Figure 6:
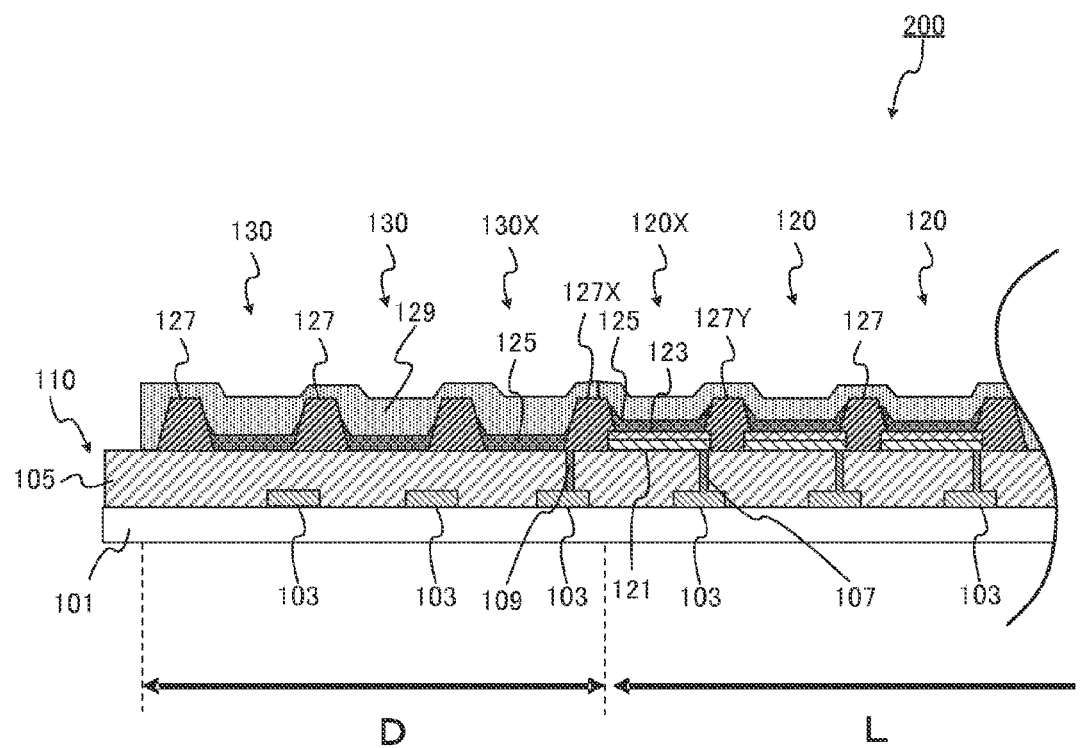
FIG. 6 is a cross-sectional view of an organic EL display panel according to Embodiment 2.

FIG. 6 is a cross-sectional view of organic EL display panel 200 of Embodiment 2 of the present invention. Description of the same constituent elements as in organic EL display panel 100 of Embodiment I will be omitted. As shown in FIG. 6, in the present embodiment, non-emissive element 130 has TFT 103. In the present embodiment, all non-emissive elements 130 have TFTs 103; however, only boundary non-emissive element 130X can have TFT 103.

As such, TFT 103 is provided in boundary non-emissive element 130X, and thereby a film shape of organic emission layer 125 of boundary light emitting element 120X can be made to be favorable.

A shape of the bank is influenced by not only whether or not there is a contact hole of an adjacent element but also whether or not there is a TFT of an adjacent element. For this reason, TFT 103 is provided in boundary non-emissive element 130X, and thereby it is possible to make a shape of boundary bank 127X and a shape of internal bank 127Y more the same as each other. As a result, it is possible to make a film shape of organic emission layer 125 of barrel 120 more favorable.

(Embodiment 3)

In Embodiment 2, a configuration in which the non-emissive element does not have a pixel electrode (a reflective anode) and a hole injection layer has been described. In Embodiment 3, a configuration in which the non-emissive element has a pixel electrode and a hole injection layer will be described.

Figure 7:
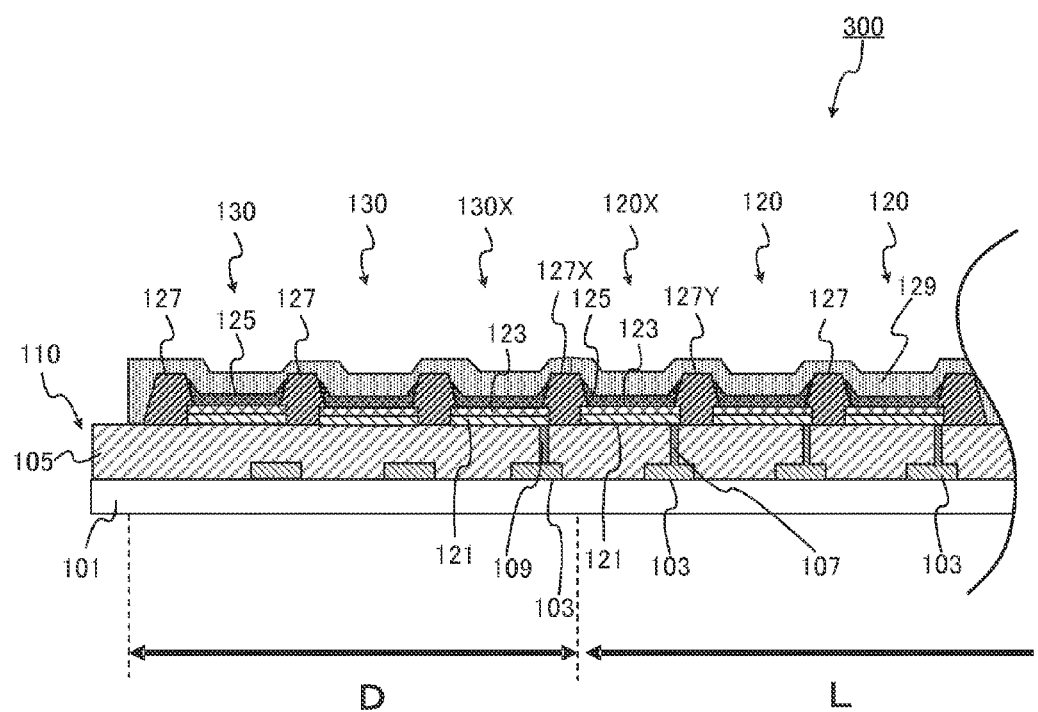
FIG. 7 is a cross-sectional view of an organic EL display panel according to Embodiment 3.

FIG. 7 is a cross-sectional view of organic EL display panel 300 of Embodiment 3 of the present invention. Description of the same constituent elements as in organic EL display panel 200 of Embodiment 2 will be omitted. As shown in FIG. 7, in the present embodiment, non-emissive element 130 has reflective anode 121. In the present embodiment, all non-emissive elements 130 have reflective anodes 121; however, only boundary non-emissive element 130X can have reflective anode 121.

As above, reflective anode 121 is provided in boundary non-emissive element 130X, and thereby it is possible to make a film shape of organic emission layer 125 of boundary light emitting element 120X more favorable.

A shape of the bank is influenced by not only whether or not there is a contact hole of an adjacent element but also whether or not there is a pixel electrode of an adjacent element. For this reason, reflective anode 121 is provided in boundary non-emissive element 130X, and thereby it is possible to make a shape of boundary bank 127X and a shape of internal bank 127Y more the same as each other. As a result, it is possible to make a film shape of organic emission layer 125 of boundary light emitting element 120X more favorable.

In addition, in the present embodiment, TFT 103 of non-emissive element 130 does not function as a transistor. If TFT 103 is made not to function as a transistor, for example, a conductive member may not be disposed in a dummy hole, and TFT 103 and reflective anode 121 may not be electrically connected to each other. As above, TFT 103 of non-emissive element 130 is made not to function as a transistor, and thereby it is possible to prevent non-emissive element 130 from emitting light unintentionally.

(Embodiment 4)

In Embodiment 4, a configuration in which the non-emissive element does not have a counter electrode will be described.

Figure 8:
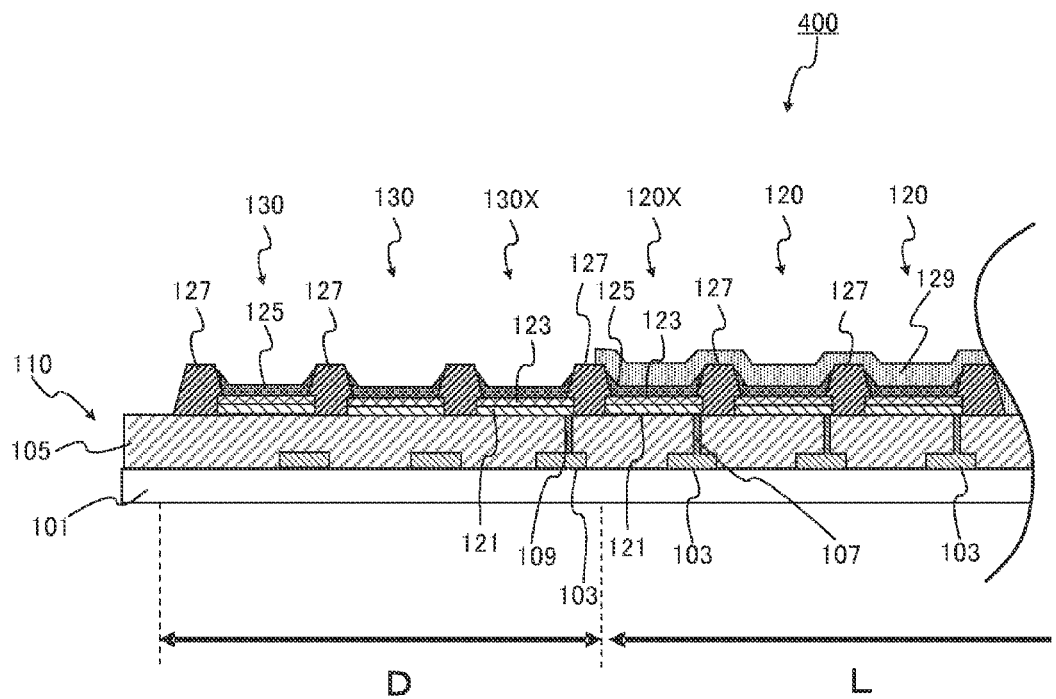
FIG. 8 is a cross-sectional view of an organic EL display panel according to Embodiment 4.

FIG. 8 is a cross-sectional view of organic EL display panel 400 of Embodiment 4 of the present invention. Description of the same constituent elements as in organic EL display panel 300 of Embodiment 3 will be omitted. As shown in FIG. 8, in the present embodiment, non-emissive element 130 does not have transparent cathode 129. Specifically, transparent cathode 129 is formed only in effective emission region L and is not formed in dummy region D. As above, if transparent cathode 129 is to be formed only in effective emission region L, a metal mask may be used when transparent cathode 129 is formed through deposition.

As above, non-emissive element 130 does not have transparent cathode 129, and thereby it is possible to more reliably prevent non-emissive element 130 from emitting light unintentionally.

(Embodiment 5)

In Embodiment 5, a configuration in which the bank defines an element arranged in a line will be described.

Figure 9A:
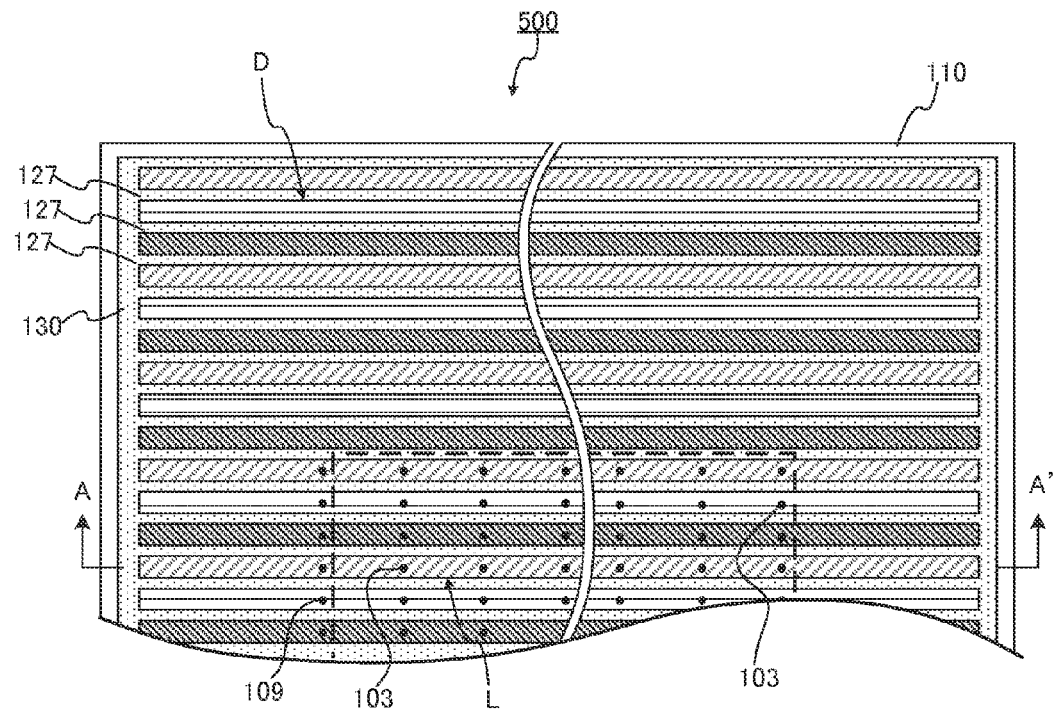
FIGS. 9A and 9B are a plan view and a cross-sectional view, respectively, of an organic EL display panel according to Embodiment 5.
Figure 9B:
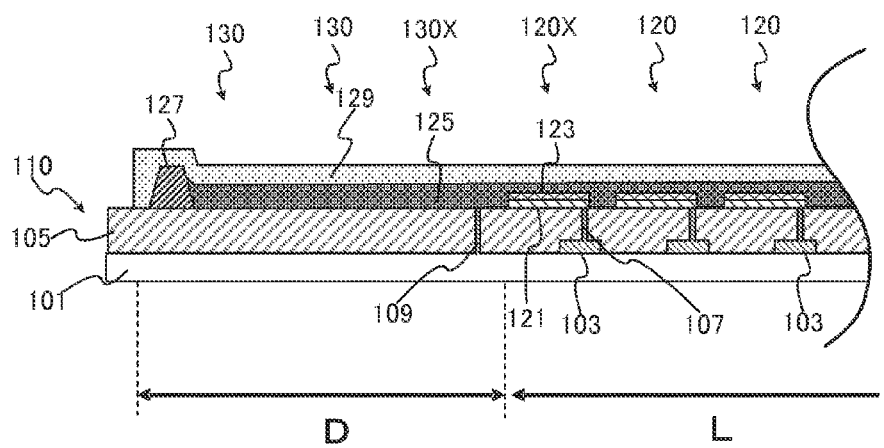

FIG. 9A is a partially enlarged view of a plane of organic EL display panel 500 of Embodiment 5, and FIG. 9B shows main portions of a cross-sectional view taken along the line AA' of organic EL display panel 500 shown in FIG. 9A. In addition, FIG. 10 is a partially enlarged view of organic EL display panel 500 shown in FIG. 9B.

Figure 10:
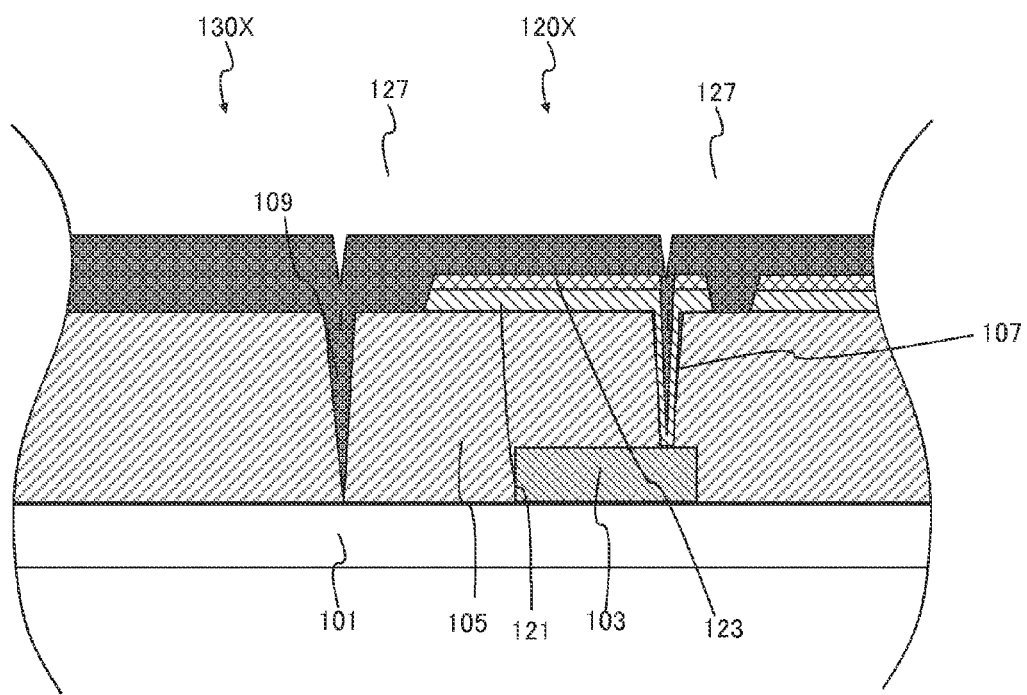
FIG. 10 is a partially enlarged view of the cross-sectional view of the organic EL display panel according to Embodiment 5.

As shown in FIGS. 9A, 9B and 10, in the present embodiment, bank 127 is a linear bank defining a line region where the elements are arranged in a line. In a case where bank 127 is formed using a photolithography method, the bank is likely to be influenced by the ground around bank 127 in a relatively unstable state between development and post-baking. More specifically, the bank in the relatively unstable state is likely to flow into contact hole 107 in the vicinity thereof or likely to be deformed so as to bend toward contact hole 107. For this reason, there are cases where contact hole 107 influences a shape of bank 127 even if the bank is formed on contact hole 107 as in linear bank 127. Therefore, also in the present embodiment, each light emitting element are defined by bank 127 which is influenced by contact hole 107. Therefore, also in the present embodiment, dummy hole 109 is formed at a position at one end side of the boundary non-emissive element is formed, and thereby it is possible to make a film shape of the light emitting element in the emission region L favorable. In addition, bank 127 has a linear shape, and thereby a coated material liquid of organic emission layer 125 can move between the elements arranged in a line so as to make film thicknesses of organic emission layers 125 of the elements more uniform.

EXAMPLE

In Example, the organic EL display panel of Embodiment 4 was manufactured. First, a planarized film was formed on a glass substrate AN100 (370 mm×470 mm×0.7 mm) manufactured by ASAHI GLASS CO., LTD. with the thickness of 5 μm, so as to create a TFT panel.

Specifically, the glass substrate which was coated with a material (Photoneece DL-1000 manufactured by TORAY INDUSTRIES, INC.) of the planarized film using spin coating was pre-baked with a hot plate of 120° C. for three minutes, in which a location where a hole was formed was exposed (exposure amount: 150 mJ/cm$^2$) with ultraviolet rays having a main peak at the wavelength 365 nm through a chrome mask, was immersed into a developer NMD-3 (TMAH (tetramethylammonium hydroxide): 2.38%) manufactured by TOKYO OHKA KOGYO CO., LTD., and was post-baked for thirty minutes in a clean oven of 230° C.

Thereby, the TFT panel provided with the hole was obtained. In Example, a hole was also formed in the boundary non-emissive element.

A silver-palladium-copper alloy (APC) film was formed with the thickness of 150 nm as a reflective electrode on the prepared TFT panel by using a sputtering method. A WOx film was formed with the thickness of 30 nm as a hole injection layer on the reflective electrode by using a sputtering method.

A bank was formed on the formed WOx by using a photolithography method. As a material, an acryl material manufactured by ASAHI GLASS CO., LTD. was used. Specifically, the acryl material was coated on the TFT panel by using a spin coating method, and was pre-baked for two minutes at temperature 100° C. Next, the material was irradiated with ultraviolet rays through a photo-mask. The bank material used in Example was a negative type material, and a bank material of an exposed position underwent a crosslinking reaction and was cured. The wavelength of the applied ultraviolet rays is a broad wavelength having a main peak at 365 nm. The exposure illuminance was 20 mW/cm$^2$, and an irradiation time was 10 seconds. In addition, the exposed bank material was developed using 0.2% of a TMAH solution (NMD-3 manufactured by TOKYO OHKA KOGYO CO., LTD.), so as to pattern the bank material. Further, the developer was cleaned with pure water, and then the TFT panel was post-baked in the clean oven of 220° C. for sixty minutes.

Next, an ink including a light emitting material is coated in a region defined by the bank by an ink jet method. As a solvent of the ink, cyclohexylbenzene was used. In addition, the coated ink was dried through decompressed drying. Specifically, the TFT panel was placed in a vacuum chamber, and the coated ink was dried through exhaust until a pressure in the chamber became 10 Pa with a vacuum pump. The exhaust time was 30 seconds, and the drying temperature was 25° C. Successively, the TFT panel was further baked with the hot plate of 130° C. for ten minutes.

Figure 11A:
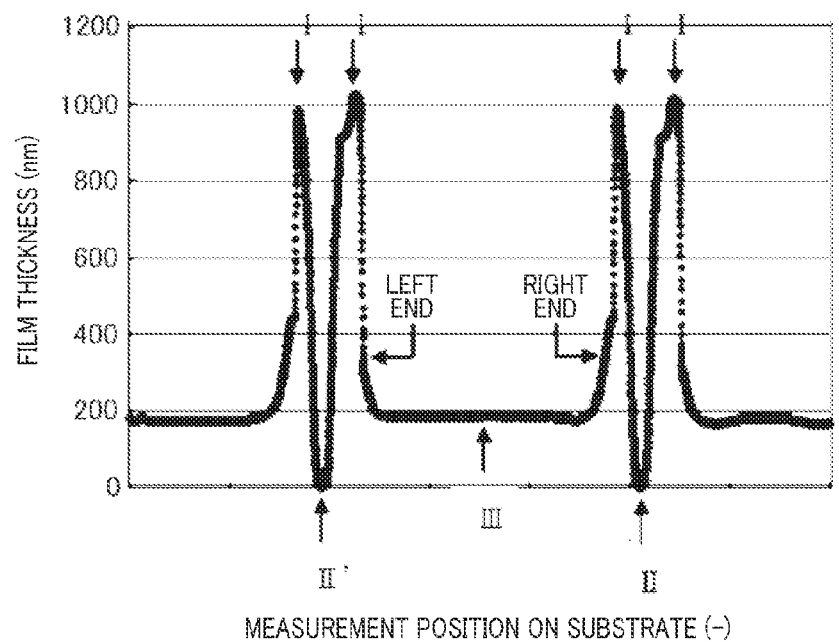
FIG. 11A is a cross-sectional profile of an organic emission layer of a boundary light emitting element of Example shown in FIG. 11B.
Figure 11B:
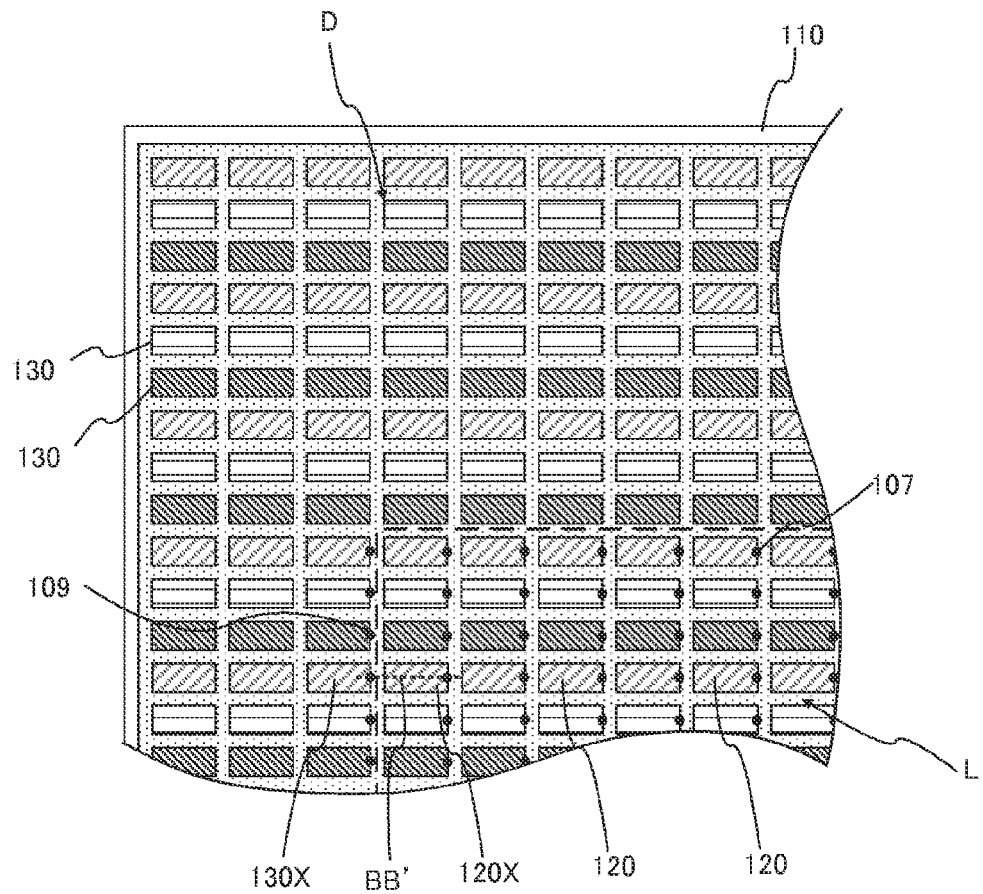

A film shape of the organic emission layer of the boundary light emitting element of the organic EL display panel manufactured in the above-described method was measured using an atomic force microscope (AS-7B manufactured by TAKANO Co., Ltd.), and a cross-sectional profile of the organic emission layer of the boundary light emitting element was obtained. The cross-sectional profile of the organic functional layer of the boundary light emitting element is shown in FIG. 11A. The profile shown in FIG. 11A is a profile of the cross-section taken along the line BB' of FIG. 11B. In FIG. 11A, the longitudinal axis expresses a film thickness (nm), the transverse axis expresses a measurement position on the substrate, the sign I indicates a bank, the sign II indicates a contact hole, the sign II' indicates a dummy hole, and the sign III indicates an organic emission layer.

In addition, a difference between the left and right film thicknesses of the organic functional layers of the boundary light emitting elements was obtained from the cross-sectional profile of FIG. 11A, using the following Equation.

Difference between left and right film thicknesses= (film thickness in left end)−(film thickness in right end)     [Equation 1]

(The left end indicates a point of the organic emission layer on the central side which is distant from a top portion of the left bank by 7.5 μm, and the right end indicates a point of the organic emission layer on the central side which is distant from a top portion of the right bank by 7.5 μm).

The difference between left and right film thicknesses of the organic emission layer of the boundary light emitting element obtained in this way is shown in Table 1.

Comparative Example

Figure 12A:
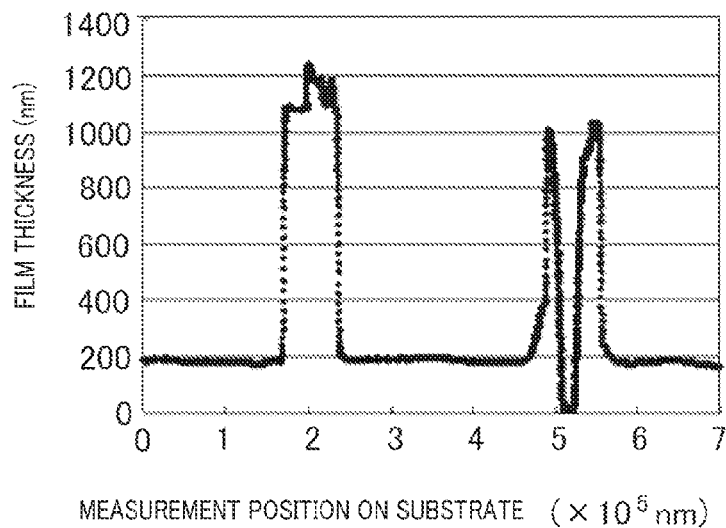
FIG. 12A is a cross-sectional profile of an organic emission layer of a boundary light emitting element of Comparative Example shown in FIG. 12B.
Figure 12B:
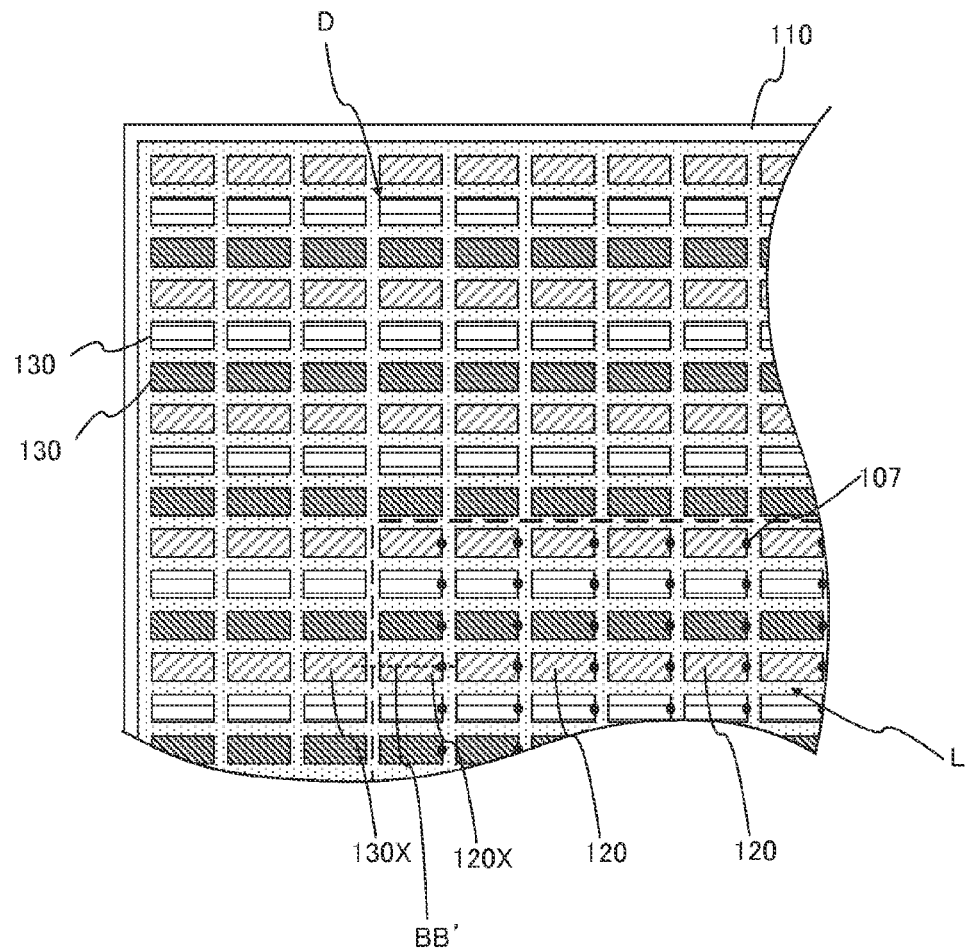

In Comparative Example, the organic EL display panel was manufactured in the same manner as in Example except that a dummy hole was not formed in the dummy region of the TFT panel. A film shape of the organic emission layer of the boundary light emitting element of the organic EL display panel of Comparative Example was measured using the atomic force microscope (AS-7B manufactured by TAKANO Co., Ltd.), and a cross-sectional profile of the organic emission layer of the boundary light emitting element was obtained. The cross-sectional profile of the organic functional layer of the boundary light emitting element is shown in FIG. 12A. In FIG. 12A, the longitudinal axis expresses a film thickness (nm), and the transverse axis expresses a measurement position (nm) on the substrate. The profile shown in FIG. 12A is a profile of a cross-section taken along the line BB' of FIG. 12B.

In addition, a difference between left and right film thicknesses of the organic emission layer of the boundary light emitting element, calculated from the cross-sectional profile of FIG. 12A, is shown in Table 1.

Evaluation of Example and Comparative Example

As shown in FIG. 11A, in Example, the heights of the bank are the same in both ends of the element. On the other hand, as shown in FIG. 12A, in Comparative Example, the heights of the bank are different in both ends of the elements. Specifically, the bank of the portion where the contact hole is formed is about 200 nm lower than the bank of the portion where the contact hole is not formed. This result suggests that the hole of the boundary non-emissive element influences a shape of the bank of the boundary light emitting element.

In addition, in Comparative Example, the reason why the height of the bank at the contact hole side of the boundary light emitting element is smaller than the height of the boundary bank is considered to be that the bank material flowed into the contact hole upon coating the bank material.

TABLE 1

|  | Difference between Left and Right Film Thicknesses |
| --- | --- |
| Example | 0.4 nm |
| Comparative Example | 2.8 nm |

Next, with reference to Table 1, a description will be made of a film shape of the organic emission layer of the boundary light emitting element of the organic EL display panels of Example and Comparative Example. Table 1 shows differences between left and right film thicknesses of the organic emission layer of the boundary light emitting element of Example and Comparative Example. The greater difference between left and right film thicknesses indicates that an inclination of the film is greater, and a film shape is worse.

As shown in Table 1, the difference between left and right film thicknesses is 0.4 nm in Example, whereas the difference between left and right film thicknesses increases to 2.8 nm. This result suggests that a film shape of the organic emission layer of the boundary light emitting element is considerably improved in Example as compared with Comparative Example.

In addition, the reason why the difference between left and right film thicknesses increases to 2.8 nm is considered to be that the heights of the bank are different in both ends of the element. As described above, this is because, since a film shape of the organic emission layer is influenced by the bank, if the heights of the bank are different in both ends of the element, film shapes of the organic emission layer are also different in both ends.

To summarize the above-described results, the hole is also formed in the boundary light emitting element, and thereby it is suggested that a shape of the boundary bank is the same as a shape of the other effective emission region bank, and thus a shape of the organic functional layer of the boundary light emitting element becomes uniform.

The disclosure of Japanese Patent Application No. 2010-283115, filed on Dec. 20, 2010, including the specification, drawings and abstract, is incorporated herein by reference in its entirety.

INDUSTRIAL APPLICABILITY

In the organic EL display panel of the present invention, a dummy hole is formed in a dummy pixel adjacent to an effective emission pixel at the other side of the effective emission pixel, and thereby an emission layer with a uniform film shape can be formed in an outermost circumference of the effective emission region. Thereby, it is possible to provide an organic EL display panel which has small luminance unevenness and emission color unevenness in a surface of the panel and thus has good display quality.

REFERENCE SIGNS LIST 100, 200, 300, 400 and 500 Organic EL display panel
101 Substrate
103 TFT
105 Planarized film
107 Contact hole
109 Dummy hole
110 TFT panel
120 Light emitting element
121 Reflective anode
123 Hole injection layer
125 Organic emission layer
127 Bank
129 Transparent cathode
130 Non-emissive element
D Dummy region
L Effective emission region

The invention claimed is:

1. An organic EL display panel comprising:
  a TFT panel that includes an effective emission region located at a central portion and a dummy region located in an outer circumferential portion and surrounding the effective emission region, the effective emission region and the dummy region including a substrate and a planarized film formed on the substrate;
  a plurality of light emitting elements disposed in the effective emission region; and
  a plurality of non-emissive elements disposed in the dummy region,
  wherein each of the light emitting elements includes:
    a thin film transistor embedded in the TFT panel;
    a contact hole provided in the planarized film at one end side of a region of each of the light emitting elements in the TFT panel;
    a pixel electrode provided on the TFT panel and connected to the thin film transistor via the contact hole;
    an organic functional layer disposed on the pixel electrode;
    a bank disposed on the TFT panel and defining a disposition region of the organic functional layer; and
    a counter electrode disposed on the organic functional layer,
  wherein each of the non-emissive elements includes:
    a bank disposed on the TFT panel; and
    an organic functional layer formed in a region defined by the bank,
  wherein, among the plurality of non-emissive elements, each of only boundary non-emissive elements adjacent to the effective emission region further includes a hole which is provided in the planarized film at a same relative position as the contact hole, the relative position is a position with respect to a center of each of the light emitting elements or the non-emissive elements, the bank included in the light emitting elements flows into the contact hole or bends toward the contact hole, and the bank included in the non-emissive elements flows into the hole included in the boundary non-emissive elements adjacent to the effective emission region or bends toward the hole.

2. The organic EL display panel according to claim 1, wherein, among the plurality of non-emissive elements, each of the boundary non-emissive elements adjacent to the effective emission region further includes a thin film transistor embedded in the TFT panel, and
  wherein the thin film transistor of each of the boundary non-emissive elements does not function.

3. The organic EL display panel according to claim 1, wherein, among the plurality of non-emissive elements, each of the boundary non-emissive elements adjacent to the effective emission region further includes a pixel electrode disposed on the TFT panel.

4. The organic EL display panel according to claim 1, wherein, among the plurality of non-emissive elements, none of the boundary non-emissive elements adjacent to the effective emission region has a counter electrode.

5. The organic EL display panel according to claim 1, wherein the bank surrounds each of the light emitting elements and each of the non-emissive elements on all sides.

6. The organic EL display panel according to claim 1, wherein the bank defines a region where the light emitting elements and the non-emissive elements are arranged in a line.

7. A method for manufacturing the organic EL display panel according to claim 1, comprising:
  preparing the TFT panel by forming the planarized film on the substrate provided with the thin film transistor;
  forming the contact hole in the planarized film at the one end side of the region of the light emitting elements, and forming the hole in the planarized film of the boundary non-emissive elements;
  forming the pixel electrode in the effective emission region of the TFT panel;
  forming the bank on the TFT panel;
  coating and forming the organic functional layer in the region defined by the bank; and
  forming the counter electrode in the effective emission region of the TFT panel.

* * * * *